Aug. 4, 1970 T. D. COE 3,522,491

HEAT TRANSFER APPARATUS FOR COOLING SEMICONDUCTOR COMPONENTS

Filed May 31, 1967

INVENTOR.
THOMAS D. COE
BY
Wolf, Greenfield & Hieken
ATTORNEYS

United States Patent Office 3,522,491
Patented Aug. 4, 1970

3,522,491

HEAT TRANSFER APPARATUS FOR COOLING SEMICONDUCTOR COMPONENTS

Thomas D. Coe, Winchester, Mass., assignor to Wakefield Engineering, Inc., Wakefield, Mass., a corporation of Massachusetts Filed May 31, 1967, Ser. No. 642,427
Int. Cl. H01l *1/12, 1/14*
U.S. Cl. 317—234 5 Claims

ABSTRACT OF THE DISCLOSURE

A studded semiconductor device heat sink is formed with a channel for accommodating the semiconductor device so that the axis of the semiconductor device can is generally perpendicular to the heat sink axis. A spring clip resides within the heat sink channel to establish good thermal and mechanical contact between the semiconductor device to be cooled and the heat sink. In one modification an electrically insulating thermally conducting layer of epoxy filled with aluminum oxide grits mechanically secures a studded base to the channelled portion of the heat sink.

BACKGROUND OF THE INVENTION

The present invention relates in general to heat transfer and more particularly concerns novel apparatus and techniques for effecting cooling of a semiconductor device by contacting a large surface area thereof which may comprise a surface that is at an electrical potential different from the chassis or other electrically and thermally conductive surface through which it is desired to withdraw heat from the device.

Most power semiconductor devices develop the greatest heat in the vicinity of the collector electrode. The power dissipation capabilities of such a device are related to the maximum collector temperature. Accordingly, it is desirable to withdraw heat from the collector in order to make the power handling capabilities of the device as high as practical. Frequently it is desired to maintain the collector potential different from the ground potential of the chassis physically suppotring the device. Such a circuit arrangement precludes the use of electrically conducting arrangements for drawing heat from the collector to the chassis for transfer into the air or other cooling medium. Accordingly, cooling of such collectors has been attempted through insulating films such as mica, Mylar, or anodically coated (such as Martin Hardcoat) aluminum wafers between the device and the electrically conducting surface at ground potential. The electrical reliability is often less than desired and the thermal resistance of such films is greater than would be desired. Hence, the power handling capabilities of a given device are lessened.

In some semicondctor devices it may be advantageous to establish thermal contact between the device collector and the encapsulating can. Even though the thermal resistance path between collector and encapsulating can may not be as low as would be optimum, in most cases increasing the withdrawal of heat from the encapsulating can helps reduce the collector operating temperature.

SUMMARY OF THE INVENTION

According to the invention, there is holder means for thermally and electrically contacting a device to be cooled, a thermally and electrically conductive means for electrically and thermally contacting an electrically and thermally conductive surface, and electrically insulating thermally conductive means connecting said holder means to said electrically conductive and thermally conductive means in electrically insulating thermally conductive relationship and including an epoxy film with aluminum oxide grits of the order of 5 mils in diameter for establishing a physically close but electrically insulating relationship between said holder means and said thermally and electrically conductive means to establish a path of low thermal resistance therebetween.

A specific means for thermally and electrically connecting a device to be cooled includes device support structure characterized by an axis of symmetry that is essentially perpendicular to the generally cylindrical axis of a device to be cooled when situated in the device support structure. The device support structure is formed with an arcuate partially annular flange for snugly engaging the generally circular device to be cooled, lower lip means for engaging the bottom of a device to be cooled while defining an opening through which the leads of the device to be cooled may be brought out for connection to external circuitry, upper cap means arranged to be separated from the latter opening by the device to be cooled and resilient thermally conducting means for establishing a path of relatively low thermal conductivity between the latter cap means and the top of the device to be cooled while also being for keeping the device snugly positioned in the device support structure in thermal and electrical contact with the annular flange and the lower lip.

Accordingly, it is an important object of this invention to provide improved methods and means for withdrawing heat from the encapsulating can of a semiconductor device.

It is another important object of this invention to provide an electrically insulating layer of high thermal conductivity between two electrically conducting surfaces.

It is still another object of the invention to provide a means for establishing good thermal contact between a semiconductor device electrode that is at a different electrical potential than a large area conducting surface capable of withdrawing considerable heat from the semiconductor device element.

It is a further object of the invention to provide methods and means for establishing good thermal contact with a relatively large area of an encapsulating can of a semiconductor device with structure that is relatively compact relatively lightweight, relatively easy and inexpensive to fabricate and arranged for relatively easy insertion and removal of a device to be cooled.

BRIEF DESCRIPTION OF THE DRAWING

Numerous other features, objects and advantages of the invention will become apparent from the following specification when read in connection with the accompanying drawing, in which.

DETAILED DESCRIPTION OF PREFERRED EMBODIMENTS

Figures 1, 2, 3, 4, 5, 6, 7, 8:
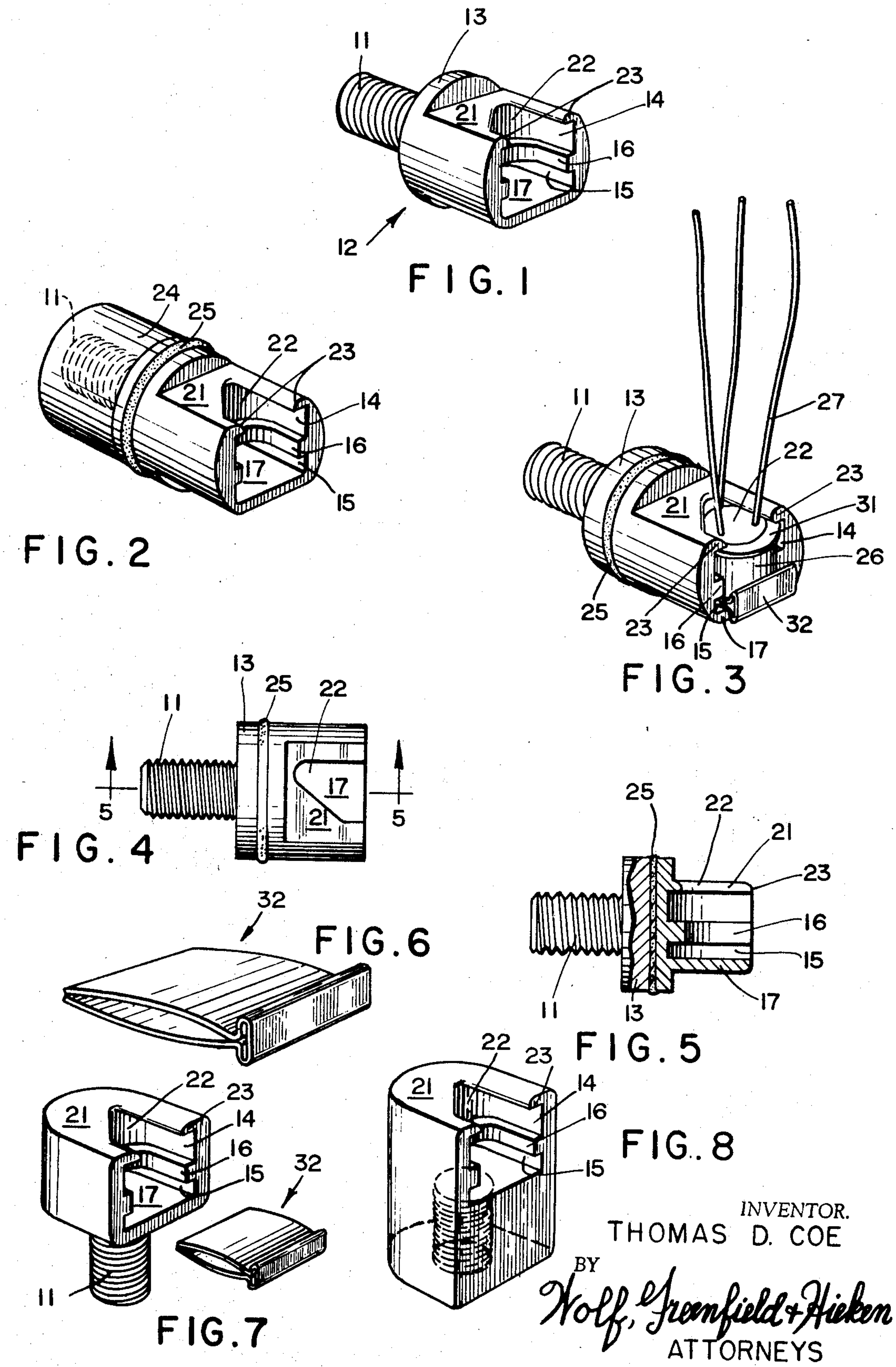
FIG. 1 is a perspective view of a studded cooling device according to the invention.
FIG. 2 is a perspective view of a modification of the device of FIG. 1 in which a relatively large volume cylindrical base having a threaded hole in the center of said base is substituted for the threaded stud.
FIG. 3 is a perspective view of another modification of the structure of FIG. 1 in which the device supporting structure is insulatedly separated from the studded base according to an important aspect of the invention and additionally showing a typical semiconductor device in place.
FIG. 4 is a top view of the cooling apparatus of FIG. 3 with the device to be cooled removed.
FIG. 5 is a sectional view of the cooling apparatus of FIGS. 3 and 4 through section 5—5 of FIG. 4.
FIG. 6 is a view of a clip that keeps a device to be cooled properly secured in the cooler.
FIGS. 7 and 8 are perspective views of other embodiments of the invention with stud and threaded socket, respectively, having respective axes parallel to that of the device being cooled.

With reference now to the drawing and more particularly FIG. 1 thereof, there is shown a perspective view of an exemplary embodiment according to the invention. A stud 11 is adapted to be threaded into a chassis normally maintained at ground potential. A metallic cup-shaped holder 12 comprising the device support structure is adapted to firmly engage the encapsulating can of a semiconductor device to be cooled. This structure 12 is shown formed as a unitary portion affixed to the disc-shaped head 13 of stud 11. This cup-shaped portion 12 is formed with a lower rectangular slot 15 separated from an upper partially annular slot 14 by an arcuate partially annular flange 16 having an inner semicircular surface adapted to contact the generally cylindrical wall of a semiconductor device encapsulating can. The device support structure 12 is formed with a top wall 17 forming an upper cap and a bottom wall 21 formed with a generally trapezoidal opening 22 to define a lower lip 23 adapted to snugly contact the bottom flange of a semiconductor encapsulating can. The device of FIG. 1 may be formed or die cast from a thermally conductive material, typically copper, aluminum, or zinc, to form a unitary structure.

Referring to FIG. 2, there is shown another embodiment of the invention similar to the embodiment of FIG. 1, but having a solid cylindrical base 24 instead of the threaded stud 11. The cylindrical base 24 may be formed with a threaded socket for receiving a mounting stud. Corresponding elements are identified by the same reference symbol in FIG. 2 and throughout the drawing.

Referring to FIGS. 3–5, there is shown still another embodiment of the invention in which the device supporting structure 12 is joined to the disc-shaped head 13 of stud 11 by an epoxy film 25 compounded from a good electrical insulating grade of epoxy filled with aluminum oxide ($Al_2O_3$) grits of the order of 5 mils in diameter and less and preferably a random mixture of grit size within the range of 0.5 mil to 5 mils. This film 25 comprises means for securing the device support structure 12 to the disc-shaped head 13 of stud 11 in electrically insulating thermally conducting relationship.

FIG. 3 shows a semiconductor device 26 in position showing how the trapezoidal opening 22 allows the device leads 27 to be easily accessible for connection to external circuits while the flange 31 of the encapsulating can snugly engages the bottom of lip 23, the inner surface of partially annular flange 16 snugly engages the cylindrical wall of the encapsulating housing, the device being held firmly in place by the resilient clip 32 wedged between the bottom surface of top plate 17 and the top surface of the encapsulating can of device 26. Thus, the device 26 may be easily slid into position with clip 32 firmly holding the assembly in place while removal of the device is easily accomplished by removing clip 32 and device 26.

FIG. 4 is a top view of the cooler shown in FIG. 3 with device 26 removed, and FIG. 5 is a sectional view through section 5—5 of FIG. 4. FIG. 6 shows clip 32.

Referring to FIGS. 7 and 8 there are perspective views of alternate embodiments with stud and socket, respectively, having respective axes parallel to that of the device being cooled.

The principle of operation is believed to reside in the distribution of grits always insuring physical separation between holder 12 and stud 11 to insure the desired electrical isolation while keeping the two so close together that the thermal resistance across the gap is very low. The epoxy resin in which the grits are distributed further lowers the thermal resistance between the stud 11 and holder 12 while at the same time effecting adhesion of the two together.

Tests conducted with structure according to the invention and prior art techniques of using an ordinary mica, Mylar, or hardcoat film show a reduction in thermal resistance of 2 or 3 to 1 for equivalent dielectric strengths.

There has been described novel apparatus and techniques affording efficient cooling compactly and economically in easy-to-use form including the feature of maintaining electrically insulated separation and substantial thermal contact between electrically and thermally conducting elements. It is evident that those skilled in the art may make numerous modifications of and departures from the specific embodiments described herein without departing from the inventive concepts. Consequently, the invention is to be construed as embracing each and every novel feature and novel combination of features present in or possessed by the apparatus and techniques disclosed herein and limited solely by the spirit and scope of the appended claims.

What is claimed is:

1. Heat transfer apparatus for cooling a semiconductor device comprising, device support structure means having an axis of symmetry that is essentially perpendicular to the generally cylindrical axis of a device to be cooled when supported in the device support structure means, said device support structure means being formed with an arcuate partially annular flange for snugly engaging the generally cylindrical device to be cooled, lower lip means for engaging the bottom of a device to be cooled while defining an opening through which the leads of the device to be cooled may pass for connection to external circuitry, upper cap means arranged to be separated from the latter opening by the device to be cooled, and resilient thermally conducting means for both establishing a path of relatively low thermal conductivity between said upper cap means and the top of the device to be cooled and for keeping the device to be cooled snugly positioned in thermal and electrical contact with said annular flange and said lower lip.

2. Heat transfer apparatus in accordance with claim 1 comprising, means defining a base of relatively high thermal and electrical conductivity, and means defining a thin layer of electrically insulating thermally conducting material of epoxy with aluminum oxide grits for fastening said device support structure to said base in electrically insulating thermally conducting relationship.

3. Heat transfer apparatus in accordance with claim 2 wherein said aluminum oxide grits comprise a random mixture of grits having diameters within the range of 0.5 to 5 mils.

4. Heat transfer apparatus in accordance with claim 1 comprising, means defining a base of relatively high thermal and electrical conductivity, and means defining a thin layer of electrically insulating thermally conducting material containing aluminum oxide grits for fastening said device support structure to said base in electrically insulating thermally conducting relationship.

5. Heat transfer apparatus in accordance with claim 4 wherein said aluminum oxide grits comprise a random mixture of grits having diameters within the range of 0.5 to 5 mils.

References Cited

UNITED STATES PATENTS

| | | | |
|---|---|---|---|
| 2,817,048 | 12/1957 | Thuermel et al. | 317—234 |
| 2,857,560 | 10/1958 | Schnable et al. | 317—235 |
| 2,887,628 | 5/1959 | Zierdt | 317—234 |
| 2,917,286 | 12/1959 | Deakin | 165—80 |
| 3,213,336 | 10/1965 | McAdam | 317—234 |
| 3,249,680 | 5/1966 | Sheets et al. | 165—80 X |
| 3,297,916 | 1/1967 | Wright | 317—100 |
| 3,355,540 | 11/1967 | Newell | 317—100 X |

JOHN W. HUCKERT, Primary Examiner

R. F. POLISSACK, Assistant Examiner

U.S. Cl. X.R.

165—80, 165; 174—15